United States Patent [19]

Whight

[11] Patent Number: 4,825,266

[45] Date of Patent: Apr. 25, 1989

[54] SEMICONDUCTOR DIODE

[75] Inventor: Kenneth R. Whight, Cowfold, England

[73] Assignee: U.S. Philips Corporation, New York, N.Y.

[21] Appl. No.: 72,196

[22] Filed: Jul. 2, 1987

[30] Foreign Application Priority Data

Aug. 8, 1986 [GB] United Kingdom ................. 8619425

[51] Int. Cl.⁴ ..................... H01L 29/90; H01L 29/78; H01L 29/34; H01L 29/74
[52] U.S. Cl. .................................. 357/13; 357/23.13; 357/52; 357/38; 357/39
[58] Field of Search ................. 357/13, 23.13, 52 DR, 357/38, 39

[56] References Cited

U.S. PATENT DOCUMENTS

| | | | |
|---|---|---|---|
| 3,577,043 | 5/1971 | Cook | 357/41 |
| 4,282,555 | 8/1981 | Svedberg | 357/13 |
| 4,305,085 | 12/1981 | Jaecklin et al. | 357/13 |
| 4,694,315 | 9/1987 | Svedberg | 357/23.13 |

Primary Examiner—Martin H. Edlow
Assistant Examiner—Robert P. Limanek
Attorney, Agent, or Firm—Steven R. Biren

[57] ABSTRACT

A semiconductor diode includes a semiconductor body having a first region (1) of one conductivity type, a second region (2) of the opposite conductivity type meeting only a given surface (4) of the body and surrounded by the first region (1) so as to form with the first region (1) a first pn junction (3) which, when reverse-biassed in operation of the diode by a voltage applied across the diode, gives the diode a blocking characteristic, and a third region (15) of the one conductivity type more highly doped than the first region (1) provided within the first region (1) for triggering conduction of the diode when a predetermined voltage less than that at which the main pn junction (3) would have broken down in the absence of the third region (15) is applied across the diode to reverse bias the first pn junction. The third region (15) meets only the given surface (4) and a passivating layer (9) on the given surface covers the third region (15). The third region (15) is located such that a depletion region extends from the first pn junction to the third region (15) when a voltage less than the predetermined voltage is applied across the diode to reverse-bias the first pn junction, the predetermined voltage being determined by the relative locations of the second region (3) and the third region (15). The third region (15) may form a breakdown ring with a fourth region (16).

13 Claims, 4 Drawing Sheets

SEMICONDUCTOR DIODE

BACKGROUND OF THE INVENTION

This invention relates to a semiconductor diode.

A semiconductor diode is known which has a first region of one conductivity type, a second region of the opposite conductivity type meeting only a given surface of the body and surrounded by the first region so as to form with the first region a first pn junction which, when reverse-biassed in operation of the diode by a voltage applied across the diode, gives the diode a blocking characteristic and a third region of the one conductivity type more highly doped than the first region provided within the first region for triggering conduction of the device when a predetermined voltage less than the voltage at which the main pn junction would have broken down in the absence of the third region is applied across the diode to reverse bias the first pn junction.

Such a semiconductor diode is described in, for example, GB-B-2113907. In particular, GB-B-2113907 describes a four layer pnpn semiconductor diode having a gateless thyristor structure. The gateless thyristor structure has a p type anode region, an n type central region, a p type central region and an n type cathode region. The two or first and second central regions form the first pn junction which is reverse-biassed when a forward voltage is applied across terminals connected to the anode and cathode regions. When such a forward voltage is applied across the gateless thyristor structure the structure maintains a blocking characteristic until the thyristor structure is triggered into conduction by breakdown of the reverse-biassed first pn junction or by a large capacitive current flowing in the central p region under the cathode region because of a rapid rise in the potential across the electrical contacts. Accordingly, such diodes can be used, for example, to protect electrical equipment from supply voltage spikes that may be dangerous because of the high voltage or because of the rapid rise in voltage.

GB-B-2113907 also describes a gateless triac structure consisting of two anti parallel gateless thyristors. Such a structure may also be known as a symmetric breakover diode. Assymmetric breakover diodes which have a thyristor structure in one direction and a two-layer diode structure in the opposite direction are also available. The I-V characteristic of an assymmetric breakover diode is shown in FIG. 1a of the accompanying drawings. The I-V characteristic of a symmetric breakover diode differs from that of an assymmetric breakover diode in that the characteristic is the same in the first and third quadrants in the case of the symmetric breakover diode.

In order for a semiconductor diode having the gateless thyristor structure described above to provide protection against a rapid voltage rise caused by, for example, a main supply voltage spike, a suitable choice of sheet resistance under the cathode region needs to be selected by determining the depth of the central or inner p and the cathode regions and the surface dopant concentrations of those regions. Previously, in order to provide protection against high voltage, that is to cause the first pn junction to breakdown to trigger conduction in the device when a given voltage is applied across the electrical contacts, the doping level of the central n region or substrate has been adjusted. However, adjustment of the doping of the central n- region is not particularly desirable because it means that various substrate for forming the n-type central region are required which have different doping concentrations to enable devices providing protection against different high voltages to be produce. As recognized in GB-B-2113907 it is not desirable to have to rely on the reverse-biassed first pn junction to control the voltage at which the semiconductor diode breaks down because breakdown of the first pn junction occurs at a relatively unpredictable voltage where the junction meets a surface of the p and n regions and therefore non-uniformities in triggering of the diode may occur. A further problem not apparently recognized in GB-B-2113907 is that, in the case of an assymetric breakover diode in particular, as the doping level of the central n- region or substrate is increased a point is reached when the transverse component of the breakdown current no longer produces a voltage sufficiently high to turn on the bottom pn junction of the thyristor structure so that true thyristor action does not occur.

Thus, as will be appreciated from the above, controlling of the breakdown of a reverse-biassed first pn junction in a semiconductor device such as a breakover diode merely by controlling the doping of one region of the first pn junction, for example the substrate in the example given above, is undesirable and becomes impracticable if the substrate doping is increased to too high a level.

In view of the above it has been proposed in GB-B-2113907 to provide a buried local highly doped n+ region at the first or main pn junction to control the breakdown voltage of the main pn junction. The local highly doped n+ region is provided within the n type central region immediately beneath the n type cathode region and spaced from the n type cathode region by the p type central region so that the n+ region is localized within the body of the device. As described in GB-B-2113907 the localized buried n+ region may be an ion-implanted phosphorus doped region which is overdoped by the central p region. The formation of such buried region can, however, be difficult to control, making it difficult to control with any precision the voltage at which the device will break down when the main pn junction is reverse-biassed. Furthermore, an additional masking stage is required to provide the buried region which necessarily increase the time and costs involved in production of the device. Additional background prior art is contained in EP-A-167440; U.S. Pat. Nos. 3,551,760 and 4,282,555; and GB-A-1300726.

According to one aspect of the invention, there is provided a semiconductor diode comprising a semiconductor body having a first region of one conductivity type, a second region of the opposite conductivity type meeting only a given surface of the body and surrounded by the first region so as to form with the first region a first pn junction which, when reverse-biassed in operation of the diode by a voltage applied across the diode, gives the diode a blocking characteristic, and a third region of the one conductivity type more highly doped than the first region provided within the first region for triggering conduction of the diode when a predetermined voltage less than the voltage at which the first pn junction would have broken down in the absence of the third region is applied across the diode to reverse bias the first pn junction, characterized in that the third region meets only the given surface and a passivating layer on the given surface covers the third region, the third region being located such that a depletion region extends from the first pn junction to the third region when a voltage less than the predetermined voltage is applied across the diode to reverse-bias the first pn junction and the predetermined voltage is determined by the relative locations of the second and third regions.

A further region meeting only the given surface and forming a pn junction with the first region may also be provided, the fourth region forming a breakdown device with the third region and being disposed between the second and the third regions.

In a particular embodiment of the present invention, a semiconductor diode in accordance with the invention may comprise a semiconductor body having a first region of one conductivity type, a second region of the opposite conductivity type meeting only a given surface of the body and surrounded by the first region so as to form with the first region a first pn junction which when reverse-biassed in operation of the diode by a voltage applied across the diode gives the diode a blocking characteristic and a third region of the one conductivity type more highly doped than the first region provided within the first region for triggering conduction of the diode when a predetermined voltage less than the voltage at which the first pn junction would have broken down in the absence of the third region is applied across the diode to reverse bias the first pn junction, characterized in that the third region meets only the given surface, a fourth region of the opposite conductivity type disposed between the second and third regions meets only the given surface and forms a pn junction with the third region and a passivating layer on the given surface covers the third and fourth regions, the third and fourth regions forming a breakdown device and the relative locations of the breakdown device and the second region being selected such that, when the first pn junction is reverse-biassed by a voltage applied across the diode, a depletion region of the first pn junction meets a depletion region of the breakdown device at an applied voltage less than the predetermined voltage and, when the predetermined voltage is applied across the diode, a reverse-biassing voltage induced across the pn junction between the third and fourth regions causes the breakdown device to breakdown to trigger conduction of the diode.

Thus, in a semiconductor diode embodying the invention the predetermined voltage at which the diode switches into conduction when the first pn junction is reverse-biassed can be controlled relatively easily by selecting the relative locations of the second and third regions. Moreover, third region meets the only the given surface so that a deep diffusion to provide a local highly doped region at the first pn junction is not necessary, thereby enabling more precise control of the voltage at which the diode will breakdown when the first pn junction is reverse-biassed compared to a diode in which a local highly doped region is provided at the first pn junction.

One or more additional regions of the opposite conductivity type may be disposed spaced-apart within the first region between the second and fourth regions to increase the reverse-biassing voltage at which the first pn junction would breakdown in the absence of the third region, the additional region meeting only the given surface and being covered by the passivating layer. The additional region(s) enable(s) greater control over the predetermined voltage to be obtained by selection of the number and position of the additional regions in addition to the selection of the location of the breakdown device. Thus by selecting the number of and position of the additional region any predetermined voltage within a large range of voltages may be selected, thus increasing the flexibility of the diode.

In an alternative arrangement, the third region may form a pn junction with and be surrounded by the second region so as to separate parts of the second region by a predetermined distance such that, when a voltage is applied across the diode to reverse bias the first pn junction, a depletion region of the first pn junction isolates the third region from the first region at an applied voltage less than the predetermined voltage and at the predetermined voltage the third region triggers conduction of the diode.

Normally, in such an alternative arrangement, the doping of the relatively highly doped third region relative to that of the first region will be such that when the predetermined voltage is applied across the diode to reverse bias the first pn junction, the reverse-biassing voltage induced across the pn junction between the second and third regions causes that pn junction to breakdown so triggering conduction of the diode.

In a further embodiment, the third region may be surrounded by the second region but separated from the second region by the first region, the predetermined voltage being determined by the separation of the third region by the first region from the second region. One or more additional regions of the opposite conductivity meeting only the given surface may be disposed spaced-apart between the second region and the third region and also between the fourth region and the third region to increase the reverse voltage at which the first pn junction would breakdown in the absence of the third region, the additional region(s) being covered by the passivating layer. Such additional region(s) enable increased control of the breakdown voltage by enabling selection of the number and position of the additional regions in addition to the position of the third region relative to the second region and also enable an increase in the flexibility of the diode by enabling any desired predetermined voltage within a large range of voltages to be selected by selecting the number and position of the additional regions.

The passivating layer may be an insulating layer or may be a semi-insulating layer. Where the layer is insulating, a resistive bleed layer may extend over the insulating layer from the first pn junction to the third region to isolate the semiconductor diode from its surroundings. Alternatively, a field plate may extend over the passivating layer from the first pn junction to the third region. Where additional regions are provided a respective field plate may be associated with each additional region.

The first and second region may form part of a gateless thyristor structure. The thyristor structure may, in addition to the first and second regions, comprise a fifth region of the one conductivity type more highly doped than the first region and disposed within the second region so as to meet only the given surface and a sixth region of the opposite conductivity type more highly doped than the second region disposed within the first region so as to meet only a further surface of the body opposed to the given surface. The thyristor structure may be arranged in antiparallel with an np or two region diode structure formed by the first and second regions, so providing an assymmetric breakover diode, or may be disposed in antiparallel with a second similar thyristor structure so forming a symmetric breakover diode. In the latter case, the semiconductor body may have a center of inversion symmetry such that the body appears identical when viewed from the given surface toward the further surface as when viewed from the further surface toward the given surface.

Where the semiconductor diode has the fifth region of the one conductivity type more highly doped than the first region mentioned above, for example where the diode has a gateless thyristor structure, in particular where the diode is a breakover diode, the third region may be formed at the same time as the fifth region and the fourth region (plus any additional region(s)) if present may be formed at the same time as the second region by using appropriate masks so that such a diode embodying the invention can be manufactured without any additional masking steps and without any significant increase in manufacturing times and/or costs.

BRIEF DESCRIPTION OF THE DRAWINGS

In order that the invention may be more readily understood, embodiments thereof will now be described, by way of example, with reference to the accompanying drawings, in which.

It should of course be appreciated that the Figures are not drawn to scale and that, in particular, relative dimensions and proportions may have been increased or decreased for the sake of clarity and ease of understanding. Similar parts are designated in each of the Figures by the same or similar reference numerals.

DESCRIPTION OF THE PREFERRED EMBODIMENTS

Referring now to the drawings, FIGS. 1 to 6 are schematic cross-sectional views of embodiments of a semiconductor diode in accordance with the invention.

The semiconductor diodes shown in FIGS. 1 to 5 are each of a type known as an assymetric breakover diode, that is a two terminal device comprising a gateless thyristor structure arranged in parallel but in the opposite direction to a two layer or np diode structure. FIG. 1a illustrates the I-V characteristic of a typical asymmetric breakover diode. As will be appreciated from FIG. 1a when a voltage is applied across the two terminals of the asymmetric breakover diode in a forward direction so that the two layer or np diode structure is reverse-biassed, the thyristor structure will initially have a blocking characteristic but at a certain voltage the thyristor structure will breakover or be triggered into conduction. The breaking over or triggering point is illustrated as point A in FIG. 1a. When a voltage is applied in the opposite direction across the two terminals then, as illustrated in FIG. 1a, the asymmetric breakover diode acts as a forward-biassed two layer or np diode.

Figure 1:
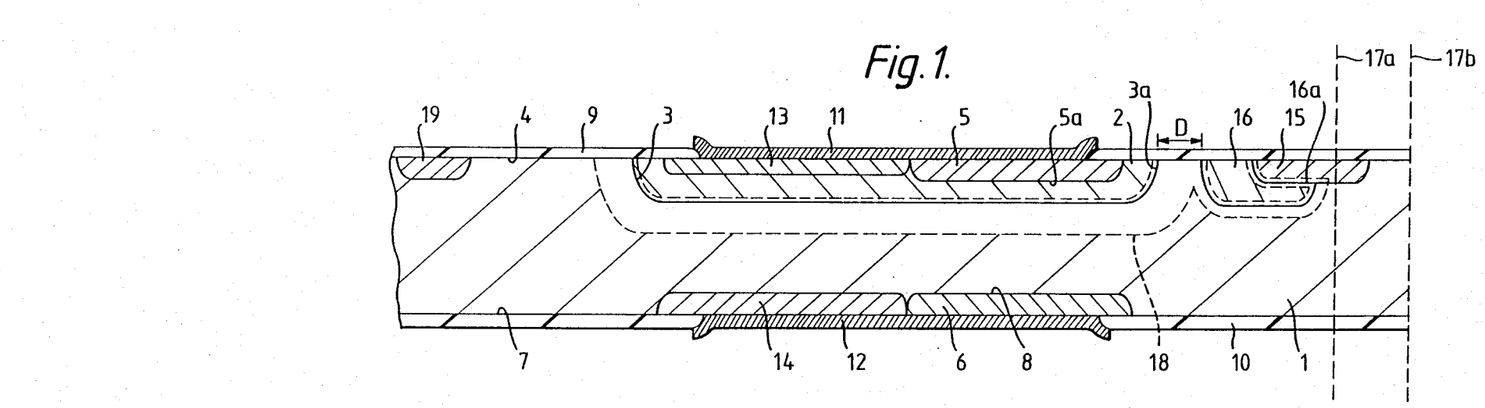
FIG. 1 is a schematic cross-sectional view of a first embodiment of a semiconductor diode in accordance with the invention.
Figure 1A:
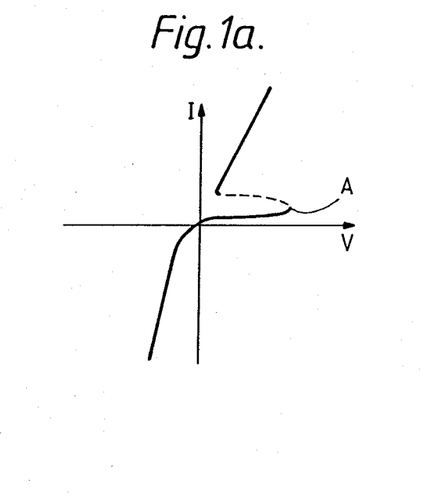
FIG. 1a illustrates the I-V characteristic for a typical known asymmetric breakover diode.

Referring now to FIG. 1, the semiconductor diode shown therein comprises a semiconductor body having a substrate or first region 1 of one conductivity type (in this example n- type conductivity, where the minus sign indicates that the substrate 1 is relatively lowly doped). The substrate 1 forms with a second region 2 of the opposite conductivity type (p type in this example) a planar first pn junction 3 which meets only a given surface 4 of the semiconductor body. The first and second regions 1 and 2 form respective first and second bases or central regions of the gateless thyristor structure (in this example the n and p bases, respectively) and also form the two layer or np diode structure. The cathode and anode of the gateless thyristor structure are formed by further regions 5 and 6, the further region 5 being of the one conductivity type (in this example the further region is n+ type, where the + sign indicates relatively high doping), and being formed within part of the second region 2 so as to meet only the given surface 4 and so as to form a planar pn junction 5a with the second region 2. As shown in FIG. 1, the further region 5 is disposed within the second region 2 so as to extend from approximately a center portion thereof toward a right hand part of the periphery of the second region 2. The further region 6 is of the opposite conductivity type (in this example p+ type) and is formed in the substrate or first region 1 so as to meet only a second surface 7 of the body opposite the given surface thus forming a planar pn junction 8 with the first region or substrate 1. The further region 6 is disposed opposite the further region 5 and is of approximately the same dimensions as the region 5 parallel to the surfaces 4 and 7.

The given and second surfaces 4 and 7 of the diode are each covered with a respective insulating layer 9 and 10, for example a layer of silicon dioxide where the semiconductor diode is a silicon device. Windows are provided in the insulating layers 9 and 10 to receive respective metallizations 11 and 12 to provide first and second terminals of the device. The metallization 11 extends over the further region 5 and the second region 2 while the metallization 12 extends over the further region 6 and part of the first region or substrate 1. As shown in FIG. 1, the doping concentration at the surface region of the second layer 2 and of the substrate 1 immediately beneath the respective metallizations 11 and 12 may be increased by the provision of a more highly doped region 13 of the opposite conductivity type (p+ conductivity type in this example) in the second region 2 and a more highly doped region 14 of the one conductivity type (n+ conductivity type in this example) in the substrate or first region 1 to improve electrical contact to the metallization.

The part of the semiconductor diode shown in FIG. 1 described so far constitutes an asymmetric breakover diode similar to known such asymmetric breakover diodes. Thus, the regions 1,2,5 and 6 form the gateless thyristor structure while the regions 1 and 2 (and the regions 13 and 14 if present) form the two-layer or np diode structure.

The pn junction 3 between the first and second regions forms a main or first pn junction of the diode which is reverse-biassed when voltage is applied to the diode in the forward direction, that is so that the terminal connected to the metallization 11 is at a lower or more negative potential than the terminal connected to the metallization 12. In a conventional assymmetric breakover diode, in such a situation the thyristor structure would be triggered into conduction or would breakover when the reverse voltage across the main pn junction reaches the breakdown voltage of the main pn junction 3, which breakdown voltage would normally be determined by the doping concentration of the substrate or first region 1. In the arrangement shown in FIG. 1, the voltage at which the thyristor structure within the diode breaks over is controlled by means of a breakdown device formed by a region 15 of the one conductivity (n+ type in this example) more highly doped than the substrate 1 provided in the substrate so as to meet only the given surface 4 and a region 16 of the opposite conductivity type (p- type in this example) which also meets only the given surface 4 and which forms a pn junction 16a the region 15, the insulating layer 9 overlying the regions 15 and 16. The regions 15 and 16 are located relative to the second region so that the region 16 is spaced-apart a given selected distance D along the given surface from the second region 2 by the first region or substrate 1 and is disposed between the second region and the region 15.

The semiconductor asymmetric breakover diode shown in FIG. 1 may be symmetrical about a first axis 17a so that the main structure of the breakover diode surrounds the breakdown device and the region 16 surrounds the region 15. Alternatively, the asymmetric breakover diode shown in FIG. 1 may be symmetrical about a second axis 17b so that the region 15 is hollow. In either case, the regions 2,5,6,13 and 14 may have any desired geometrical shape when viewed in plan (that is when viewed perpendicular to the surfaces 4 and 7). Thus, the regions 2,5,6,13 and 14 may be formed by circular or other polygonal annuli. The breakdown device has the same peripheral shape as the second region so that there is a constant separation D between the second region and the region 16. Thus, the region 16 will be a circular or other polygonal shape annuli depending on the shape of the regions 2,5,6,13 and 14 and the region 15, if hollow (i.e. when the device is symmetrical about the second axis 17b), will have the same geometrical shape as the region 16 when viewed in plan. When the assymmetric breakover diode is symmetrical about the second axis 17b, the breakdown device may be formed by breakdown regions formed by discrete regions 15 and 16 (which may be, for example, circular, rectangular etc) positioned about an inner periphery 3a of the first pn junction 3 at the given selected constant distance D therefrom. It should of course be appreciated that the breakdown device need not be disposed so as to form a symmetrical arrangement but that the breakdown device may be disposed at any particular desired region in the main breakover diode structure where it is desired for the device to breakdown. Thus, the axis 17a and 17b need not necessarily be symmetry axis of the diode. It will, of course, be appreciated that normally the same geometrical shape will be chosen for the various regions in a particular assymmetric breakover diode.

In the case of the asymmetric breakover diode shown in FIG. 1, as a voltage applied across the terminals in the forward direction, that is so that the first pn junction 3 is reverse-biassed, increases, the depletion layer of the first pn junction 3 spreads until at a certain voltage the depletion region of the first pn junction 3 reaches or contacts the zero bias depletion region of the floating breakdown device 15 and 16. At this point, the potential of the region 16 increases with the voltage applied across the two terminals of the diode until the reverse voltage thus induced across the pn junction 16a of the breakdown device reaches the breakdown voltage of the breakdown device. Breakdown of the junction 16a generates a hole current h which flows through the joined depletion regions into region 2 and under the region 5 and to the terminal connected to the metallization 11 (via the region 13 if present) and an electron current e which flows through the substrate 1 over and across the region 6 and to the terminal connected to the metallization 12 (via the region 14 if present). The thus generated electron and hole currents forward bias the pn junctions 5a and 8 triggering conduction of the thyristor structure within the assymmetric breakover diode. The dashed lines 18 in FIG. 1 illustrate the extent of the depletion region when the depletion region of the first pn junction 3 has reached that of the breakdown device 15, 16, cross-hatching being omitted in the depletion regions.

The voltage at which the semiconductor diode shown in FIG. 1 breaks over in the forward direction is thus related to the separation D of the region 16 from the region 2 by the first region or substrate 1 and is in fact determined by that separation for constant doping concentrations, junction depths and geometry of the regions 1, 2, 15 and 16.

As the semiconductor diode is designed to breakover into conduction at a voltage which is considerably lower than the voltage at which breakdown may occur at the edges of the body, edge passivation of the device is not necessary. Channel stoppers in the form of regions 19 of the one conductivity (n+ type in this example) may however be provided at the edges of the semiconductor body outside the spread of the depletion region of the pn junction 3. Such channel stoppers can be formed in the same step as the region 5 and the region(s) 15 by using an appropriate mask.

Figure 2:
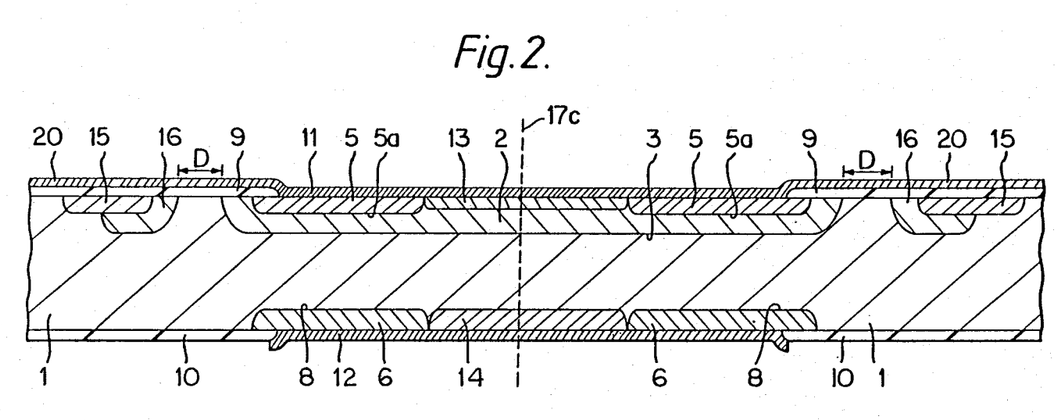
FIG. 2 is a schematic cross-sectional view of a modified embodiment of the semiconductor diode shown in FIG. 1.

FIG. 2 illustrates a modification of the semiconductor diode shown in FIG. 1. Thus, as shown in FIG. 2, the breakdown device 15, 16 is in the form of a circular or other polygonal annulus which surrounds the main breakover diode structure and is spaced therefrom by the distance D. The semiconductor diode shown in FIG. 2 is symmetric about an axis 17c so that the regions 5 and 6 are annular and surround, respectively, the regions 13 and 14. Of course, the breakdown device 15, 16 may be formed by separate breakdown areas 15, 16 spaced apart around the periphery of the region 2 and separated from the region 2 by the distance D.

FIG. 2 illustrates a further modification of the semiconductor diode in FIG. 1. Thus, as shown, the metallization 11 is extended to form a field plate or plates 20 extending from the main junction to the breakdown device 15 and 16 and further to the channel stopper 19 (not shown in FIG. 2), if provided. The field plate(s) may be replaced by a resistive bleed layer, for example a layer of polycrystalline silicon, which extends over the insulating layer 9 to the breakdown device 15, 16 or, if provided, the channel stopper 19. Alternatively, the insulating layer 9 may be replaced by a semi insulating layer, for example a layer of oxygen doped polycrystalline silicon, which acts as a highly resistive bleed layer.

The lower surface 7 of the diode shown in FIG. 2 may be field plated by the heat sink (not shown) to which the diode is secured in use.

The semiconductor diodes shown in FIGS. 1 and 2 may be manufactured by existing power semiconductor technology. Thus, for the example given above, the substrate 1 may be lowly doped n- type monocrystalline silicon in which the various regions are formed by diffusion and/or ion implantation in a known manner. The dopant used to produce the p type conductivity regions may be boron while that used to produce the n type conductivity regions may be arsenic or phosphorous. The region(s) 16 may be formed at the same time as the second region using an appropriate mask while the region(s) 15 may be formed at the same time as the region 5 using an appropriate mask. Thus, the addition of the breakdown device need not increase the number of processing steps or masks required to produce the breakover diode. Silicon dioxide is grown thermally over the surfaces 4 and 7 to form the insulating layers 9 and 10, and contact windows opened in the insulating layers into which metal such as aluminum is deposited to form the metallizations 11 and 12. Of course, semiconductor material other than silicon may be used, for example germanium or a III-V compound.

Thus, as the region(s) 16 and the region(s) 15 may be formed at the same time as the region 2 and the region 5, respectively, using the same mask, the possibility of misalignment between the regions 16 and 2 and between the regions 5 and 15 due to mask misalignment does not arise and the separation D can be well controlled, enabling precise control of the breakdown voltage. The regions 15 and 16 are arranged to overlap by two or three times the mask alignment tolerance (usually 3 micrometers).

Figure 1B:
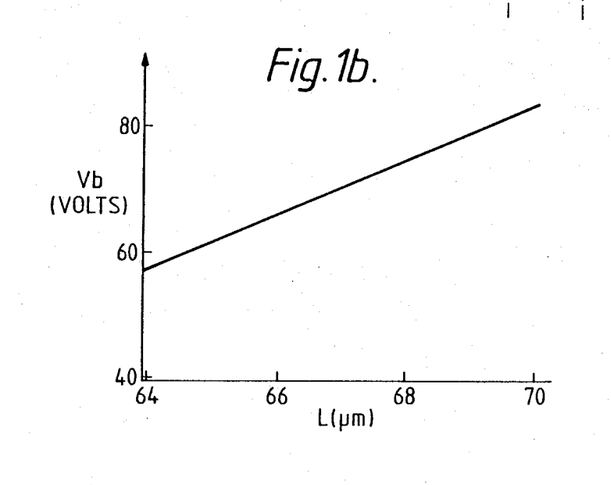
FIG. 1b illustrates graphically the relationship between the voltage at which breakdown is initiated and the separation of a breakdown device of the asymmetric breakover diode shown in FIG. 1 from the first pn junction thereof.

As described above, the distance of separation D of the region 16 from the second region 2 is selected so that the assymmetric breakover diode 1 will breakover at a desired voltage. To take a particular set of parameters, where the substrate 1 is of thickness 230 micrometers with a dopant concentration of $1 \times 10^{14} cm^{-2}$, the second region 2 and region 16 have a thickness or depth of 30 micrometers and a surface dopant concentration of $6 \times 10^{18} cm^{-3}$, the region 15 and the regions 5 and 14 have a thickness or depth of 14 micrometers and a surface dopant concentration of $1 \times 10^{21} cm^{-3}$ and the regions 13 and 8 have a thickness of 10 micrometers and a surface dopant concentration of $1 \times 10^{20} cm^{-3}$, then the breakdown voltage of the breakdown device 15, 16 will be about 30 volts and the voltage Vb at which the assymmetric breakover diode will breakover will depend on the distance D (which is equal to the mask edge separation L minus two sideways diffusions, in this example D=L−54 microns) and may be approximately 57 volts where the distance D is approximately ten micrometers and approximately 80 volts where the distance D is approximately fifteen micrometers. FIG. 1b illustrates graphically the relationship between the breakover voltage Vb and L for the parameters given above.

It may of course be possible to omit the region 16 or to separate the regions 16 and 15 so that breakdown is controlled by the selected location, within the spread of the depletion region of the pn junction 3, of the region 15. Where the region 16 is omitted, the region 15 may form a pn junction with the region 2 or may be separated therefrom by a distance D. Of course, as the region 15 cannot be produced using the same masking step as the region 2, the latter arrangement would be sensitive to mask misalignment tolerances.

Figure 3:
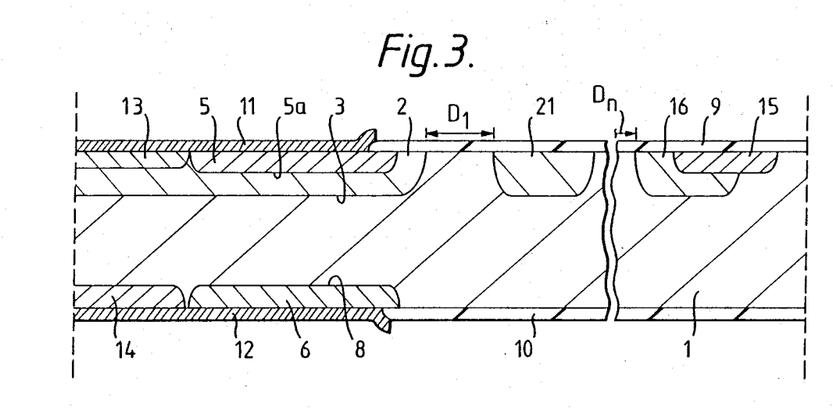
FIG. 3 is a schematic cross-sectional view of another modification of the semiconductor diode shown in FIG. 1.

FIG. 3 illustrates a modification of the assymmetric breakover diodes shown in FIGS. 1 and 2 in which one or more floating guard rings 21 are provided between the second region 2 and the breakdown device 15 and 16. Each ring 21 is in the form of a region of the opposite conductivity type (p in this example) meeting only the given surface 4 of the semiconductor body and covered by the insulating layer 9. The rings 21 may be formed during the same process step as the region 2 and the region 16 so avoiding mask misalignment problems. The breakover voltage of the arrangement shown in FIG. 3 is a function of each of the distances Di (i=1, 2, ... n) where Di is the separation of the second region from the inner ring 21, Dx is the separation of the x−1th ring 21 from the xth ring 21 and Dn is the separation of the breakdown device 15, 16 from the outermost ring 21.

The rings 21 serve to increase the voltage at which the first pn junction would otherwise breakdown in the absence of the breakdown device, while the breakdown device 15, 16 as before serves to cause the assymmetric breakover diode to breakover into conduction at a voltage less than that at which the assymmetric breakover diode would have broken over if the region 15 were not present.

Thus, by selecting the number and relative positions of the rings 21 and using the ring 21 system in conjunction with the breakdown device 15, 16, it should be possible for the semiconductor diode to be designed to be triggered into conduction at any voltage between approximately 85% of the plane breakdown voltage (that is the breakdown voltage which would be obtained for a flat non-curved junction between the selected substrate 1 and second region 2), which may be approximately 1000 for the parameters given above, and the breakdown voltage of the breakdown device 15 and 16 (which fro the parameters given above was 30 volts) using the same highly resistive substrate material.

A resistive bleed layer (not shown) shorted to the rings 21 may be provided in the arrangement shown in FIG. 3 to shield the semiconductor body, or field plates (not shown) may be attached to the rings 21. Alternatively, the insulating layer 9 may be replaced by a semi-insulating layer, for example a layer of oxygen doped polycrystalline silicon.

Various different floating ring structures are described in, for example, Published European Applications EP-A-115093, EP-A-124139 and EP-A-182422.

Figure 4:
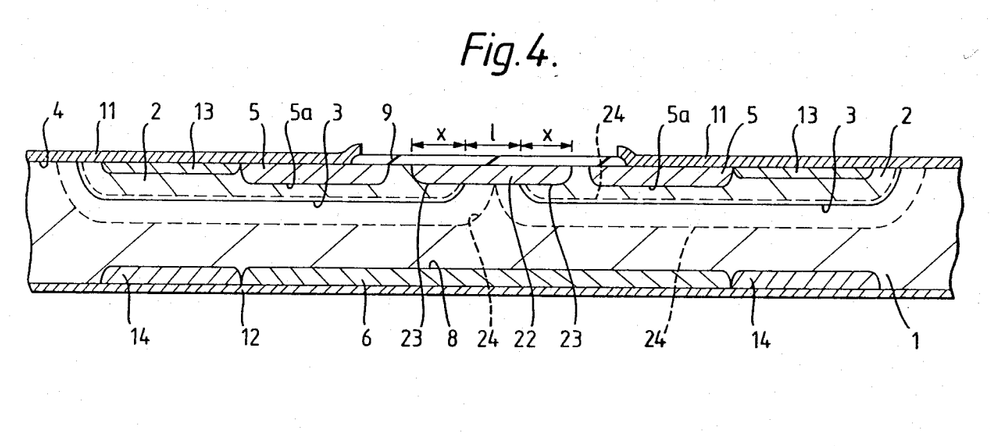
FIG. 4 is a schematic cross-sectional view of a further embodiment of a semiconductor diode in accordance with the invention.

FIG. 4 illustrates a further embodiment of a semiconductor diode in accordance with the invention.

As can be seen from FIG. 4, the semiconductor diode, like the semiconductor diodes shown in FIGS. 1 to 3, is an asymmetric breakover diode. In the semiconductor diode shown in FIG. 4 the second region 2, and therefore also the region 5, are annular in shape. If present, the region 13 will surround the region 5 and will also be annular. Similarly, if present, the region 14 will surround the region 6 and will be annular. As used herein the term annular is intended to cover both circular annuli and annuli of any other polygonal periphery, for example square or rectangular frame-like shapes. As shown in FIG. 4, the breakdown device 15, 16 of the semiconductor diodes shown in FIGS. 1 to 3 is replaced by a central breakdown region 22 of the one conductivity type ($n^+$ conductivity type in this example) more highly doped than the substrate 1. The central breakdown region 22 is formed in the substrate 1 so as to meet only the given surface 4 and so as to form a pn junction 23 with the innermost periphery of the second region 2. An insulating layer 9 is provided on the given surface to extend over the central breakdown region 23 onto the region 5. Of course, the second region 2 and therefore correspondingly the region 5 and, if present, the region 13, need not be annular but may comprise two or more separated regions equally spaced around the central breakdown region 22, it then merely being necessary for each second region 2 to form a pn junction with the central breakdown region 22.

The semiconductor diode shown in FIG. 4 may be manufactured in a manner similar to the devices shown in FIGS. 1 to 3 with suitable modifications, in particular the central breakdown region 22 may be formed at the same time as the region(s) 5 using an appropriate mask.

For given doping concentrations, junction depths and geometry for the various regions (for example the parameters given above in relation to FIGS. 1 to 3 with the region 22 having the same parameters as the regions 5), the voltage at which the semiconductor diode shown in FIG. 4 will breakover into conduction when the first pn junction 3 is reverse-biased will depend on the location of the second region(s) 2 relative to the region 22, that is the distance l along the surface 4 separating adjacent edges of the second region(s) 2 across the central breakdown region 22, which distance l is, of course, determined by the relevant mask dimensions and lateral diffusion of the dopant used to produce the regions 2 and 22.

Thus, in use of the device shown in FIG. 4, as the reverse voltage applied across the main pn junction(s) 3 increases, the depletion region(s) of the main pn junction(s) 3 spread until, at an applied voltage less than the breakdown voltage of the main pn junction(s) 3, the depletion region(s) meet(s) across the central breakdown region 22 as shown by the dashed line 24 in FIG. 4 (the depleted region being shown without hatching). At this point the central region 22 becomes isolated from the substrate 1 and, instead of rising with the voltage across the main pn junction 3, the voltage of the central region 22 rises more slowly than the voltage across the pn junction 3 so that a reverse voltage induced across the pn junction(s) 23 between the central breakdown region 22 and the region(s) 2 increases with further increase in the reverse voltage across the main pn junction 3 until the reverse voltage across the pn junction 23 between the central region 22 and the region(s) 2 causes the pn junction 23 to break down, generating hole and electron currents which trigger the thyristor structure into conduction in a manner similar to that described in relation to FIG. 1. Thus, by selecting the distance l, the voltage at which the semiconductor diode breaks over can be chosen merely by the provision of the central breakdown region 22 which can be produced in the same masking step as the region(s) 5.

The arrangement shown in FIG. 4 is more sensitive to processing parameters than the arrangements described above in relation to FIGS. 1 to 3. Accurate control of the diffusion of the second region 2 and region 22 is required because the breakover voltage of the arrangement shown in FIG. 4 is sensitive to the junction depths of regions 2 and 22. Moreover, if, possibly due to mask misalignment problems, the overlap x between the central breakdown region 22 and the region(s) 2 is rather small so that the overlap is formed by the laterally diffused portions of the regions 2 and 22 and the central region 22 is relatively lowly doped, the breakover voltage of the semiconductor diode shown in FIG. 4 may be controlled partly by the distance l but also by the distance x.

Figure 5:
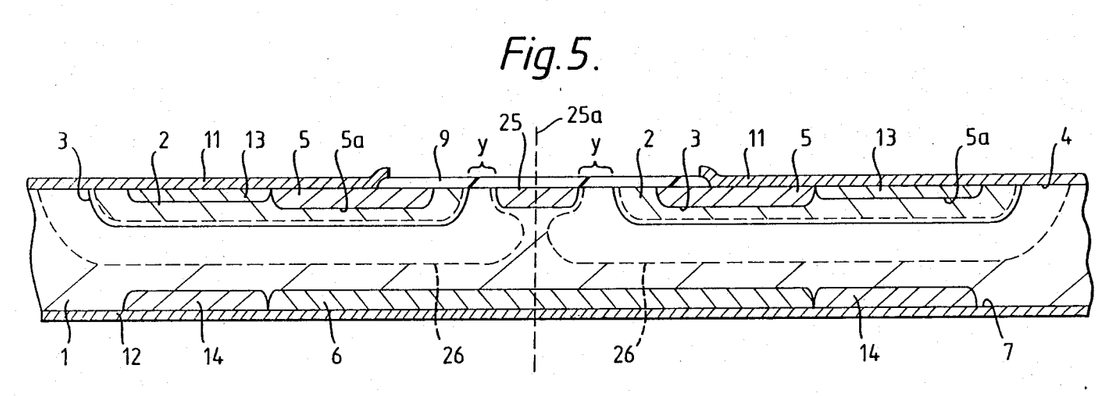
FIG. 5 is a schematic cross-sectional view of another embodiment of a semiconductor diode in accordance with the invention.

FIG. 5 illustrates another embodiment of an asymmetric breakover diode in accordance with the invention which is somewhat similar to that shown in FIG. 4 but differs in that the central breakdown region 22 of the asymmetric breakover diode shown in FIG. 4 is replaced by a central breakdown region 25 of the one conductivity type ($n^{30}$ type in this example) which is disposed in the substrate 1 so as to meet only the surface 4 and so as to be separated from the region(s) 2 (which has(have) the same configuration as in FIG. 4) by a predetermined distance y determined, as will be appreciated, by the mask separation used for the region(s) 2 and the central breakdown region 25 and the respective lateral diffusions of the region(s) 2 and the central breakdown region 25.

The distance of separation y determines the voltage at which the asymmetric breakover diode shown in FIG. 5 will break over into conduction given constant concentration, junction depth and geometry parameters, for example the concentration and depth parameters discussed above in relation to FIGS. 1 to 3, the central breakdown region 25 having the same parameters as the region(s) 5. Thus, in use of the asymmetric breakover diode shown in FIG. 5, as a reverse voltage applied across the main pn junction 3 increases, the depletion region of the main pn junction spreads until it reaches the relatively highly doped central breakdown region 25. The effect of the central breakdown region 25 is to stop the depletion region spreading further so that, as shown by the dashed line 26 in FIG. 5 (the depletion region is shown unhatched) as the reverse voltage applied across the main pn junction 3 increases still further, the field in the area of the central breakdown region 25 increases until a point is reached at which breakdown occurs at the main pn junction 3 generating hole and electron currents which act in a manner similar to that described in relation to FIG. 1 to trigger conduction of the thyristor structure, the reverse voltage across the main pn junction, and therefore the voltage applied across the assymmetric breakover diode, at which this occurs being determined by the distance y for given doping concentration, geometrical and junction depth parameters.

Although not shown, one or more floating guard rings may be provided between the central breakdown region 25 and the region 2 in a manner similar to that shown in FIG. 3 so that the structure is symmetric about an axis 25a so as to increase the reverse voltage at which the main pn junction 3 would breakover in the absence of the region 25, the voltage at which the assymmetric breakover diode actually breaks over being a function of each of the separations yi (i = 1, 2 . . . , n), where y is the separation of the second region 2 from the outer or first ring $y_x$ is the separation of the x-1th and xth rings and $y_n$ is the separation of the last or innermost ring from the breakdown region 25.

As discussed in relation to FIGS. 1 to 3, a resistive layer may be provided over the insulating layer on the central breakdown region 23 or 25 or the insulating layer may be replaced by a semi-insulating layer acting as a highly resistive bleed layer. Alternatively, field plates may be provided as discussed above.

Thus, in each of the arrangements described above, by selecting the relative locations of the second and third regions 2 and 15 (FIGS. 1 to 3) or 2 and 22 (FIG. 4) or 2 and 25 (FIG. 5) the gateless thyristor structure can be triggered when a predetermined desired voltage is applied across the two terminals of the asymmetric breakover diode to reverse bias the main pn junction 3, the predetermined voltage being determined by the relative locations of the second and third regions for given doping concentration, junction depth and geomtry parameters.

Figure 6:
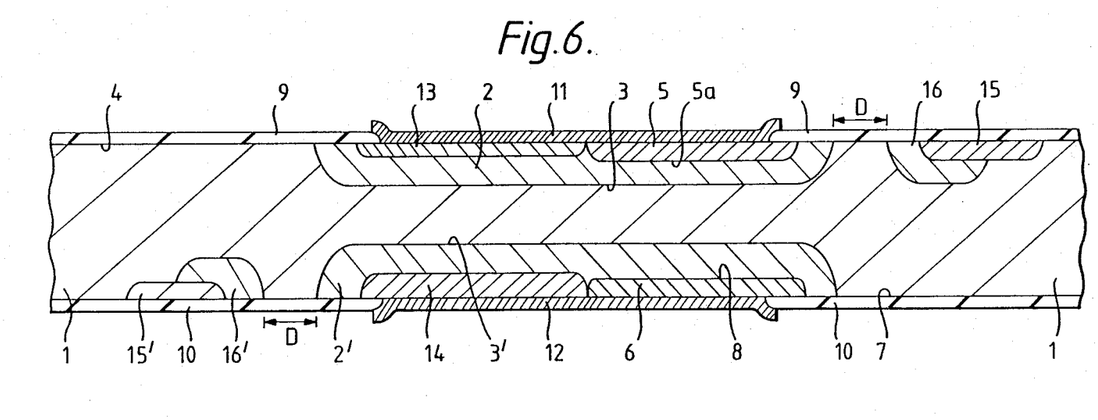
FIG. 6 is a schematic cross-sectional view of a symmetrical breakover diode embodying the invention.

Although all of the embodiments described above relate to asymmetric breakover diodes, it should of course be appreciated that the invention may also be applied to symmetric breakover diodes that is devices which consist of two antiparallel gateless thyristor structures. If the invention is applied to such a symmetric breakover diode, then the diode will normally have a center of inversion symmetry so that it appears identical when viewed from the surface 4 to the surface 7 and vice versa, although it may be possible for a breakdown device such as the device 15, 16 of FIGS. 1 to 3, or a central breakdown region 24 or 25, to be associated with only one of the thyristor structures. FIG. 6 illustrates a symmetric breakover diode having a breakdown device arrangement similar to that shown in FIG. 1 but provided with an additional region 2' of the opposite conductivity type (n type in the example shown) so as to form a symmetric breakover diode. The additional region 2' forms with the substrate 1 a pn junction 3' corresponding to the first pn junction 3, the pn junction 3' being forward-biassed when the first pn junction is reverse-biassed and vice versa. A first breakdown device 15, 16 at the given surface 4 is associated with the first pn junction 3 and a second breakdown device 15', 16' at the surface 7 is associated with the pn junction 3'.

It should, of course, be appreciated that the invention is applicable to any semiconductor diode in which it is desired to control the voltage at which a reverse-biassed planar pn junction will breakdown to render the diode conducting, for example a zener diode, and is not restricted to use in breakover diodes.

From reading the present disclosure, other modifications may be apparent to persons skilled in the art. Such modifications may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalization or modification of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A semiconductor diode comprising a semiconductor body having a first region of one conductivity type, a second region of the opposite conductivity type meeting only a given surface of the body and surrounded by the first region so as to form with the first region a first pn junction which when reverse-biassed in operation of the diode by a voltage applied across the diode gives the diode a blocking characteristic and a third region of the one conductivity type more highly doped than the first region provided within the first region for triggering conduction of the diode when a predetermined voltage less than the voltage at which the first pn junction would have broken down in the absence of the third region is applied across the diode to reverse bias the first pn junction, characterized in that the third region meets only the given surface, a fourth region of the opposite conductivity type disposed between the second and third regions meets only the given surface and forms a pn junction with the third region and a passivating layer on the given surface covers the third and fourth regions, the third and fourth regions forming a breakdown device and the relative locations of the breakdown device and the second region being selected such that, when the first pn junction is reverse-biassed by a voltage applied across the diode, a depletion region of the first pn junction meets a depletion region of the breakdown device at an applied voltage less than the predetermined voltage and, when the predetermined voltage is applied across the diode, a reverse-biassing voltage induced across the pn junction between the third and fourth regions causes the breakdown device to breakdown to trigger conduction of the diode.

2. A semiconductor diode according to claim 1, wherein at least one additional region of the opposite conductivity type is disposed spaced-apart within the first region between the second and fourth regions to increase the reverse-biassing voltage at which the first pn junction would breakdown in the absence of the third region, each additional region meeting only the given surface and being covered by the passivating layer.

3. A semiconductor diode comprising a semiconductor body having a first region of one conductivity type, a second region of the opposite conductivity type meeting only a given surface of the body and surrounded by the first region so as to form with the first region a first pn junction which, when reverse-biassed in operation of the diode by a voltage applied across the diode, gives the diode a blocking characteristic, and a third region of the one conductivity type more highly doped than the first region provided within the first region for triggering conduction of the diode when a predetermined voltage less than the voltage at which the first pn junction would have broken down in the absence of the third region is applied across the diode to reverse bias the first pn junction, the third region being surrounded by and forming a pn junction with the second region so as to separate parts of the second region by a predetermined distance such that, when a voltage is applied across the diode to reverse bias the first pn junction, a depletion region of the first pn junction isolates the third region from the first region at an applied voltage less than the predetermined voltage and at the predetermined voltage the third region triggers conduction of the diode.

4. A semiconductor diode comprising a semiconductor body having a first region of one conductivity type, a second region of the opposite conductivity type meeting only a given surface of the body and surrounded by the first region so as to form with the first region a first pn junction which, when reverse-biassed in operation of the diode by a voltage applied across the diode, gives the diode a blocking characteristic, and a third region of the one conductivity type more highly doped than the first region provided within the first region for triggering conduction of the diode when a predetermined voltage less than the voltage at which the first pn junction would have broken down in the absence of the third region is applied across the diode to reverse bias the first pn junction, the third region being surrounded by the second region and being separated from the second region by the first region, said predetermined voltage being determined by the separation of the third region by the first region from the second region.

5. A semiconductor diode according to claim 4, wherein one or more additional regions of the opposite conductivity meeting only the given surface are disposed spaced-apart between the second region and the third region to increase the reverse-biassing voltage at which the first pn junction would breakdown in the absence of the third region, the at least one additional region being covered by the passivating layer.

6. A semiconductor diode according to claim 3, 4 or 1 wherein a resistive bleed layer extends over the insulating layer from the first pn junction to the third region.

7. A semiconductor diode according to claim 3, 4 or 1 wherein a field plate extends over the insulating layer from the first pn junction to the third region.

8. A semiconductor diode according to claim 2 or 5, wherein a respective field plate is associated with each additional region.

9. A semiconductor diode according to claim 3, 4 or 1 wherein the first and second regions form part of a gateless thyristor structure.

10. A semiconductor diode according to claim 9, wherein the thyristor structure comprises, in addition to the first and second regions, a fifth region of the one conductivity type more highly doped than the first region disposed within the second region so as to meet only the given surface and a sixth region of the opposite conductivity type more highly doped than the second region disposed within the first region so as to meet only a further surface of the body opposed to the given surface.

11. A semiconductor diode according to claim 9, wherein the thyristor structure is arranged in antiparallel with an np diode structure formed by the first and second regions provide an asymmetric breakover diode.

12. A semiconductor diode according to claim 9, wherein the thyristor structure is disposed in antiparallel with a second similar thyristor structure to form a symmetric breakover diode.

13. A semiconductor diode according to claim 12, wherein the semiconductor body has an inversion axis of symmetry.

* * * * *